United States Patent [19]

Kuki

[11] 4,356,481
[45] Oct. 26, 1982

[54] SOURCE VOLTAGE DROP DETECTING CIRCUIT

[75] Inventor: Takakuni Kuki, Tokyo, Japan
[73] Assignee: Nippon Electric Co., Ltd., Tokyo, Japan
[21] Appl. No.: 138,948
[22] Filed: Apr. 9, 1980

[30] Foreign Application Priority Data

Apr. 11, 1979 [JP] Japan .................................. 54-43991

[51] Int. Cl.³ ...................... G08B 21/00; G01R 19/16
[52] U.S. Cl. ................................... 340/636; 455/115; 455/226
[58] Field of Search ................ 340/636, 663; 455/115, 455/226

[56] References Cited

U.S. PATENT DOCUMENTS

3,877,001 4/1975 Bogut et al. ..................... 340/636 X
4,160,246 7/1979 Martin et al. .................... 340/636 X

FOREIGN PATENT DOCUMENTS

1338256 11/1973 United Kingdom ................ 340/636

*Primary Examiner*—John W. Caldwell, Sr.
*Assistant Examiner*—Daniel Myer
*Attorney, Agent, or Firm*—Sughrue, Mion, Zinn, Macpeak and Seas

[57] ABSTRACT

A voltage drop detection circuit provides an accurate indication of battery voltage in an apparatus subject to large fluctuations in load current regardless of the battery internal resistance. The detection circuit periodically induces an increase in load current so as to reproduce the maximum load current drawn by the apparatus, and the resulting battery terminal voltage is compared to a fixed reference. The detection circuit finds particular utility in apparatus designed to use a variety of battery types.

8 Claims, 5 Drawing Figures

FIG 1
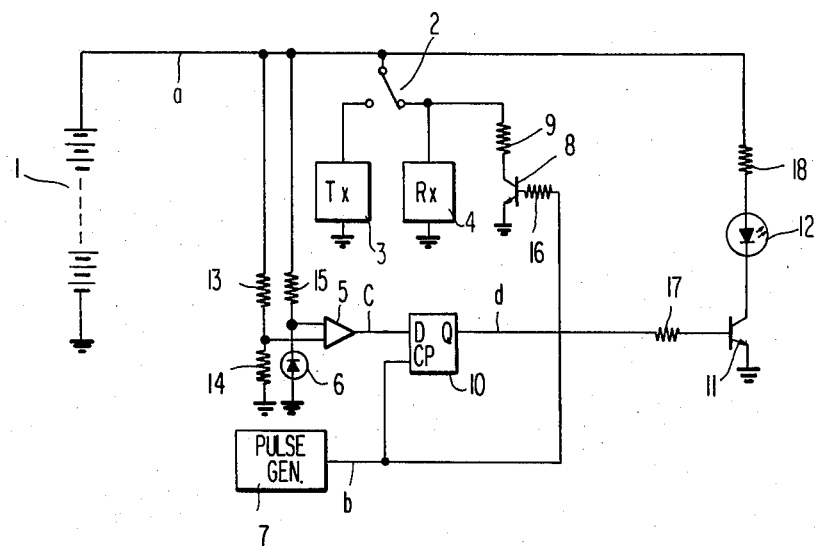
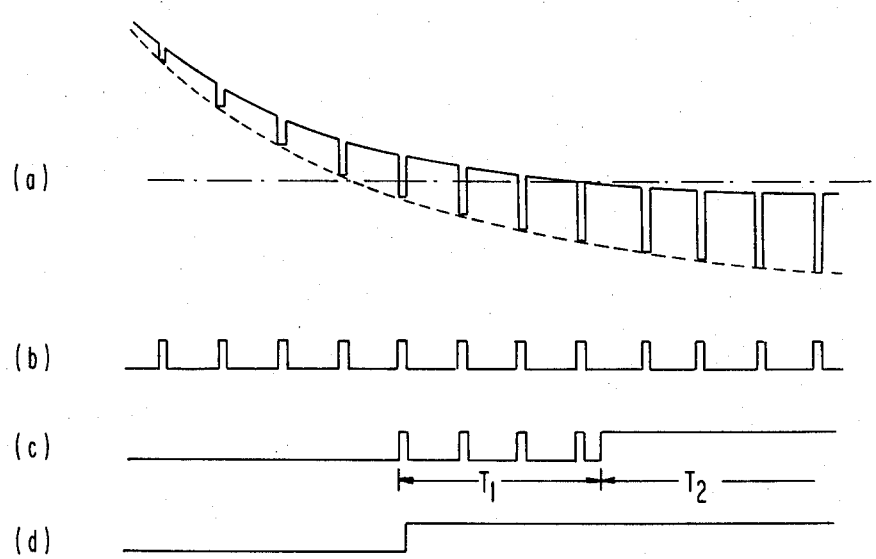
FIG 2

SOURCE VOLTAGE DROP DETECTING CIRCUIT

BACKGROUND OF THE INVENTION

The present invention relates to a source voltage drop detecting circuit for use in electronic apparatus, and more specifically to a battery voltage drop detecting circuit for use in a radio transceiver.

In an electronic apparatus having a battery or batteries incorporated therein, an alert function is often desired to indicate reduction in the battery voltage beyond a tolerable limit.

A conventional source voltage drop detecting circuit includes means for detecting the battery terminal voltage with respect to a predetermined reference voltage to thereby produce a detection signal indicating a voltage drop in the battery. However, when using such a detecting circuit in an apparatus of the type where load current fluctuates to a great extent, such as a transmitter/receiver apparatus, it has been necessary to select the reference voltage at a level higher than the minimum operating voltage of the apparatus in order to consider both the internal resistance of the battery and the maximum load current.

In the case of a transceiver, for example, a load current (e.g. 100 mA) in the receive mode is less than that in the transmit mode (e.g. 500 mA). Accordingly, it may occur that even if the battery terminal voltage exceeds the minimum operating voltage of the transceiver in the receive mode, the battery terminal voltage may drop to less than the minimum operating voltage for the transmit mode when the press-to-talk switch is activated. Therefore, the relatively higher reference voltage is selected in order to detect in the receive mode that the battery is presently depleted so that transmission is not possible.

Use of the conventional voltage drop detecting circuit is complicated in that it cannot be used with apparatus of the type adapted for use with a variety of batteries having different internal resistances. This is due to the fact that the selection of the reference voltage varies depending upon the battery internal resistance.

With respect to a transceiver, reference is made to the U.S. Pat. No. 4,041,390.

SUMMARY OF THE INVENTION

An object of the present invention, therefore, is to provide a source voltage drop detecting circuit which can be used with batteries having any internal resistance.

According to the invention, there is provided a voltage drop detecting circuit for an apparatus having a first means operable when supplied with a first current, a second means operable when supplied with a second current greater than the first current, and a battery selectively connected to the first and second means in time-division fashion, the drop in voltage of the battery being detected when it reaches a predetermined value, the detection circuit comprising: a third means for generating a series of pulses; a fourth means selectively connected to the battery and adapted to conduct during the period of the pulses an auxiliary current substantially equal to the difference between said first and second current in response to the series of pulses during the operation of the first means and a fifth means for comparing the output voltage of said battery and a predetermined reference voltage to provide detection output.

BRIEF DESCRIPTION OF THE DRAWINGS

The invention will now be described in further detail referring to the accompanying drawings, wherein:

FIG. 1 is a block diagram of a press-to-talk type transceiver using a source voltage drop detecting circuit according to the present invention;

FIGS. 2(a) through (d) are waveforms observed at respective portions of FIG. 1;

DETAILED DESCRIPTION OF THE INVENTION

Figure 3A:
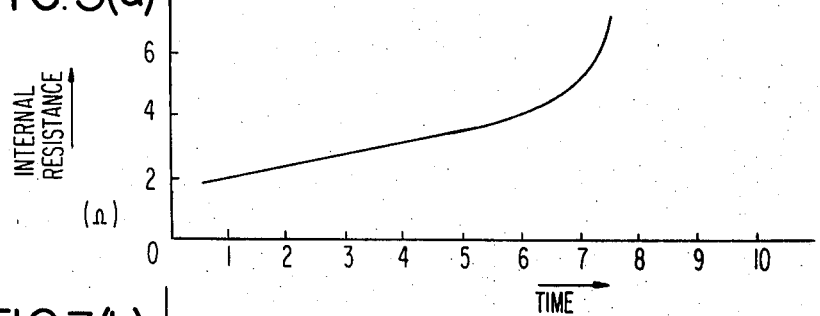
FIGS. 3(a) through (b) are examples of the respective internal resistance and voltage characteristics of nickel-cadmium (Ni-Cd) battery being used in the circuit of FIG. 1.

Referring to FIG. 1, a transmitter 3 and a receiver 4 are alternatively connected to battery 1 through a press-to-talk switch 2. When the switch 2 is in the right-hand position, the transceiver is in the receiving mode and when it is in the left-hand position, the transceiver is in the transmitting mode. A voltage comparator 5 compares a reference voltage produced by a zener diode 6 and a resistor 15, to a voltage obtained from the battery terminal through voltage dividing resistors 13 and 14, and provides a logic "1" level output when the zener reference voltage is higher. The ratio of voltage dividing resistors 13 and 14 is so selected that when the battery terminal voltage drops below the minimum operating voltage of the transmitter, the compartor provides the logic "1" level. A pulse generator 7 produces pulses of significantly small duty cycle, e.g., tens of milliseconds at intervals of tens of seconds. The pulses turn transistor 8 on so that current flows through a dummy load resistor 9. The value of resistor 9 is so selected that the sum of the current through resistor 9 and the current drawn by the receiver 4 be approximately equal to the current drawn by the transmitter 3.

A D-type flip-flop 10 samples and stores the output of the voltage comparator 5 under the control of pulse generator 7. The Q output terminal from the flip-flop 10 is connected to the base of transistor 11 through resistor 17. An LED (Light Emitting Diode) 12 is connected to the collector of the transistor 11. When the logic "1" level appears at the Q output terminal, the transistor 11 is biased on and activates LED 12 to provide an alert signal indicating a voltage drop in the battery. The resistors 16 and 18 are current limiters.

FIG. 2 shows waveforms at respective portions of the circuit of FIG. 1. The ordinates in FIGS. 2(a) through (d) represent voltage while the abscissas represent time. FIG. 2(a) generally represents the terminal voltage of the battery 1, the solid line showing values of voltage in the receiving mode. If the press-to-talk switch 2 is depressed, the battery terminal voltage drops as shown by the broken line (transmit mode). The one-dot chain line indicates the minimum operating voltage of the transmitter. FIG. 2(b) shows the output of the pulse generator 7; (c), the output of the comparator 5; and (d), the output of the flip-flop 10.

In the detecting circuit the transistor 8 is biased on under the control of pulses from the pulse generator 7 as shown in FIG. 2 so that even in the receiving mode the battery 1 must provide the load current approximately equal to that in the transmit mode. The output of the comparator 5 at that time is sampled and stored in the flip-flop 10. Accordingly, if the battery is exhausted to the extent that transmission is impossible, the transistor 11 will be activated by the output of flip-flop 10 as shown in FIG. 2(d) to energize the LED 12 which provides an alert while the transceiver is in the receive mode.

Thus, the detecting circuit of the invention can detect, whether the battery is too depleted to drive heavy loads, irrespective of the battery's internal resistance and even during the period of a light load operation. This does, however, result in a slight increase in the depletion rate of the battery.

Figure 3B:
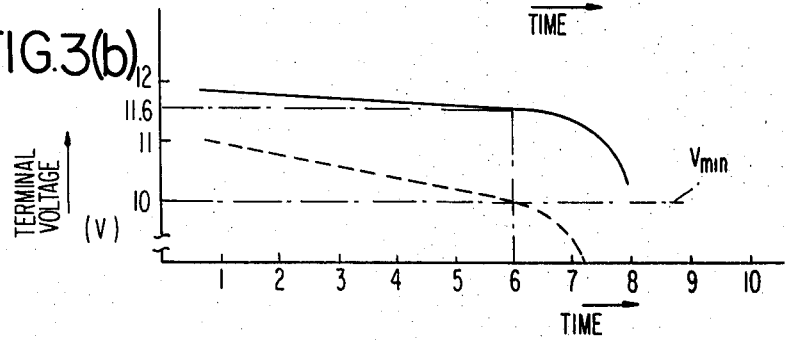

For example, it is assumed that the transceiver uses ten batteries in serial connection, which batteries may alternatively be Mn dry cells or Ni-Cd batteries. It is also assumed that the consumption of power in the transceiver is rated at 100 mA in the receiving mode and 500 mA in the transmitting mode, and the minimum operating voltage is 10 V. Ni-Cd batteries are first considered. Ten of such Ni-Cd batteries in serial connection have an initial voltage of 12 V and an initial internal resistance of about 2Ω, the internal resistance increases and the voltage decreases with time as the batteries are used as shown in FIGS. 3(a) and (b), respectively. In FIG. 3(a), the battery internal resistance amounts to 4Ω after a lapse of 6 hours. At this point, the terminal voltage may be represented by:

$$12\ V - (100\ mA \times 4\Omega) = 11.6\ V,$$

since the power consumption for the receive mode (shown by the solid line of FIG. 3(b)) is 100 mA. Since the 11.6 V figure exceeds the minimum operating voltage of 10 V, there will be no problem in the receive mode. For the transmit mode (shown by the broken line of FIG. 3(b)), however, because of the current consumption is 500 mA, the terminal voltage may be represented by:

$$12\ V - (500\ mA \times 4\Omega) = 10\ V.$$

Further, use of the battery source beyond this point will render transmission impossible. This minimum operating voltage is shown at Vmin in FIG. 3(b). Therefore, a conventional voltage drop detector must detect whether the terminal voltage gets lower than 11.6 V in the receive mode.

Figure 4A:
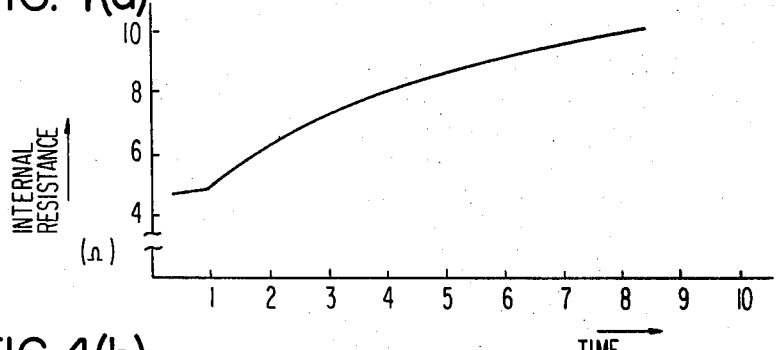
FIGS. 4(a) and (b) are examples of the respective internal resistance and voltage characteristics of a manganese (Mn) dry cell being used in the circuit of FIG. 1.
Figure 4B:
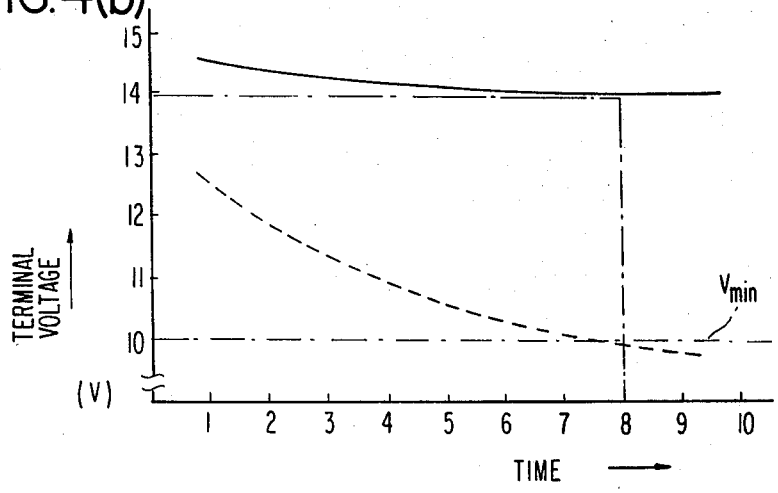

Next, suppose that the same transceiver mounts Mn dry batteries. Ten of such Mn dry batteries in serial connection have an initial potential of 15 V and an initial internal resistance of about 5Ω. As was the case with Ni-Cd batteries, the internal resistance increases and the terminal voltage decreases with time as shown in FIGS. 4(a) and (b), respectively. FIG. 4(a), the battery internal resistance amounts to 10Ω after the lapse of about 8 hours and the terminal voltage for the transmit mode (shown by the broken line of FIG. 4(b)) is 10 V. Thereafter, transmission is no longer practicable. Since the terminal voltage for the receive mode (shown by the solid line of FIG. 4(b)) is 14 V the detection voltage must be selected as 14 V where a conventional voltage drop detecting circuit is used.

Thus, use of a conventional detecting circuit is complicated since the detection voltage must be changed depending on the type of battery to be used in the transceiver. According to the present invention, however, the detection voltage may be set at the minimum operating voltage of 10 V, for either the Ni-Cd battery of the Mn dry cell. The subject invention has great utility since there is a substantial demand for apparatus which may use either battery type.

While the use of the present invention slightly shortens the battery life, the effect is negligible. Suppose in the above described transceiver having a current consumption of 500 mA in the transmit mode and 100 mA in the receive mode, a transmission/reception ratio of one-to-nine occurs with normal usage. Then, with a 30 msec pulse per minute to be generated by the pulse generator 7, the average consumption of current represents an increase of only 0.14% because the time for the 500 mA rate is increased by 0.05% (0.03 sec per min).

Figure 5:
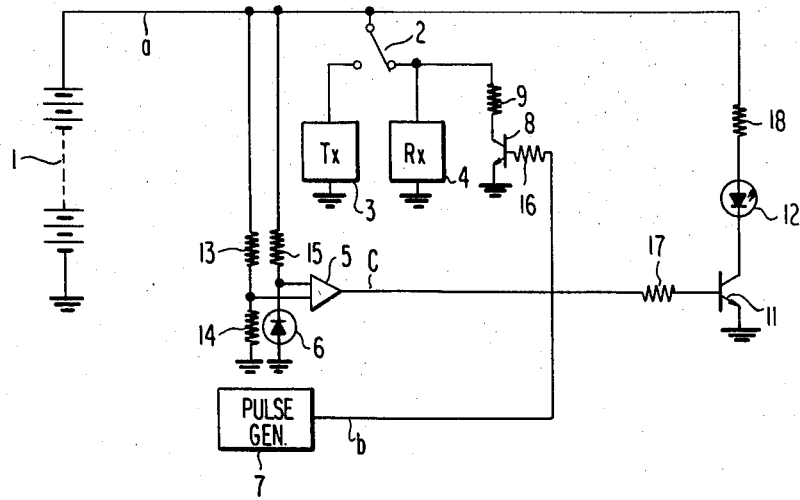
FIG. 5 is a block diagram of a press-to-talk type transceiver using another source voltage drop detecting circuit according to the present invention.

It is to be noted that the average consumption of current is reduced with a longer pulsing interval provided by the generator 7, but this reduces the time accuracy for detection of a voltage drop. Similarly, a shorter pulse width reduces the average current consumption. However, the width of at least tens of mseconds is preferred in view of the stabilized detection time for the detecting circuit and its response speed to rapid load changes in the battery. Further, it is alternatively possible to omit the flip-flop 10 as shown in FIG. 1 and instead connect the output of the comparator 5 directly to the resistor 17, as shown in FIG. 5. In this case, the LED 12 is intermittently activated during the period $T_1$ and constantly activated during the period $T_2$ as shown in FIG. 2(c). Although an LED has been described and shown as an alert means for a voltage drop, any other convenient means e.g., lamp, loud speaker, etc., may be employed.

What is claimed is:

1. A voltage drop detection circuit for an apparatus having first electronics means operable when supplied with a first current for performing a first function, second electronics means operable when supplied with a second current greater than said first current for performing a second function, and a battery selectively connected to said first and second electronics means in a time-division fashion, the drop in voltage of said battery being detected when it reaches a predetermined value, said detection circuit comprising: third means for generating a series of pulses; fourth means selectively connected to said battery and adapted to conduct during the period of said pulses an auxiliary current substantially equal to the difference between said first and second current in response to said series of pulses during the operation of said first means; and fifth means for comparing the output voltage of said battery with a predetermined reference voltage to provide a detection signal.

2. The voltage drop detecting circuit according to claim 1 wherein said apparatus is a transceiver and said first electronics means is a signal receiver and said second electronics means is a signal transmitter.

3. The voltage drop detecting circuit according to claims 1 or 2 wherein said apparatus is a transceiver and said first electronics means operates for a substantially longer period of time than said second electronics means.

4. The voltage drop detecting circuit according to claim 1 further comprising means coupled to said fifth means for generating alert signals in response to said detection signal.

5. The voltage drop detecting circuit according to claim 1 wherein said fifth means comprises a voltage comparator for comparing said output voltage of said battery and said reference voltage, and means for sampling and holding the output of said voltage comparator in response to said series of pulses, thereby to generate said detection signal.

6. The voltage drop detecting circuit according to claim 1 wherein said fourth means comprises: a transistor having a collector-emitter circuit in parallel with said first means and a base receiving said series of pulses; and a resistor in said collector-emitter circuit, the value of said resistor being chosen so that said transistor conducts said auxiliary current.

7. A transceiver comprising:

signal receiving means connected to a first terminal;

signal transmitting means connected to a second terminal;

battery means selectively providing power in a time-division manner to said signal receiving means through said first terminal and to said signal transmitting means through said second terminal, said signal receiving means when operative constituting a receiving load for said battery means and said transmitting means when operative constituting a transmitting load for said battery, said transmitting load being greater than said receiving load;

voltage dividing means receiving voltage from said battery means and providing an output having a selected ratio to the voltage level of said battery;

reference voltage means for providing a reference voltage;

comparator means receiving as inputs said reference voltage and an output of said voltage dividing means for comparing the two;

pulse generator means for generating pulses;

flip-flop means receiving as inputs the output of said comparator means and said pulses from said pulse generator;

a first transistor having its base connected to an output of said flip-flop means, its emitter connected to ground, and its collector connected through a light emitting diode to said battery means;

a second transistor having its base connected to an output of said pulse generator, its emitter connected to ground and its collector connected through a dummy load to said first terminal;

said dummy load having a value such that when said second transistor is biased on, said receiving load and said dummy load together provide a load substantially equal to said transmitting load.

8. A transceiver comprising:

signal receiving means connected to a first terminal;

signal transmitting means connected to a second terminal;

battery means for providing power to said first terminal and said second terminal, said signal receiving means when operative constituting a receiving load for said battery means and said transmitting means when operative constituting a transmitting load for said battery means, said transmitting load being greater than said receiving load;

switch means for selectively switching said battery means between said first and second terminals;

voltage dividing means connected to said battery means and providing an output in a predetermined ratio to the voltage level of said battery means;

reference voltage means for providing a reference voltage;

comparator means receiving as respective comparison inputs said reference voltage and an output of said voltage dividing means;

pulse generator means;

a first transistor having a base connected to an output of said comparator means, an emitter connected to ground and a collector connected through a light-emitting diode to said battery means;

a second transistor having a base connected to an output of said pulse generator, an emitter connected to ground, and a collector connected through a dummy load to said first terminal, said dummy load having a resistance value such that when said second transistor is biased on, said receiving load and said dummy load together provide a load for said battery means substantially equal to that of said transmitting load.

* * * * *

UNITED STATES PATENT AND TRADEMARK OFFICE
CERTIFICATE OF CORRECTION

PATENT NO. : 4,356,481
DATED : October 26, 1982
INVENTOR(S) : Takakuni KUKI

It is certified that error appears in the above—identified patent and that said Letters Patent is hereby corrected as shown below:

Column 2, line 36, change "compartor" to --comparator--.

Signed and Sealed this

Twenty-second Day of February 1983

[SEAL]

Attest:

Attesting Officer

GERALD J. MOSSINGHOFF
Commissioner of Patents and Trademarks